United States Patent
Zarabadi et al.

(10) Patent No.: US 6,194,941 B1
(45) Date of Patent: Feb. 27, 2001

(54) DC OFFSET COMPENSATION CIRCUIT FOR A SIGNAL AMPLIFIER

(75) Inventors: Seyed Ramezan Zarabadi, Kokomo; Mark Russell Keyse, Sharpsville; Pedro Enrique Castillo-Borelly; William Joseph Hulka, both of Kokomo, all of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/290,929

(22) Filed: Apr. 13, 1999

(51) Int. Cl.$^7$ ....................................... H03L 5/00
(52) U.S. Cl. ................. 327/307; 327/378; 330/9
(58) Field of Search ................... 327/307, 378, 327/563; 330/9, 259, 290

(56) References Cited

U.S. PATENT DOCUMENTS

| | | | |
|---|---|---|---|
| 4,356,450 | 10/1982 | Masuda | 330/9 |
| 4,912,714 | * 3/1990 | Hatanaka et al. | 372/31 |
| 5,053,877 | * 10/1991 | Kondo et al. | 358/228 |
| 5,463,410 | * 10/1995 | Uchiyama et al. | 347/133 |
| 5,644,127 | * 7/1997 | Ohmae | 250/231.16 |
| 6,038,432 | * 3/2000 | Onoda | 455/127 |

* cited by examiner

Primary Examiner—Kenneth B. Wells
(74) Attorney, Agent, or Firm—Jimmy L. Funke (57) ABSTRACT

A DC offset compensation circuit (34) for compensating for a DC offset voltage of a signal amplifier (24) includes a first sample and hold circuit (40) having an input receiving an amplifier output signal (VOUT2) and an output supplying the sampled and held output signal (VOUT2) to a non-inverting input of a comparator 42. A first digital-to-analog (D/A) circuit (46) is responsive to a number of digital input signals to produce an analog DC target signal at an output ($V_D$) thereof. The analog DC target signal is provided to an input of a second sample and hold circuit (50) having an output supplying the sampled and held analog DC target signal to an inverting input of the comparator 42. The output of the comparator 42 is provided to an offset cancellation control circuit (56) including a state machine (66) and a counter circuit (68) operable to modify a count value (OFFDAC) thereof depending upon statuses of a number of input control signals (CLK1, CLK2, STRT, STP) and the comparator output signal (CO). A second D/A circuit has a number of digital inputs receiving the count value (OFFDAC) and producing at an output (VDCO) thereof an analog DC compensation signal corresponding thereto. The analog DC compensation signal is provided to a input (VDCO) of the signal amplifier (24) to thereby force the DC component of the amplifier output signal (VOUT2) near the analog DC target signal, thereby minimizing an aggregate DC offset voltage attributable to the signal amplifier (24).

12 Claims, 8 Drawing Sheets

DC OFFSET COMPENSATION CIRCUIT FOR A SIGNAL AMPLIFIER

TECHNICAL FIELD

The present invention relates generally to DC offset compensation circuits, and more specifically to such circuits operable to minimize an aggregate DC offset voltage attributable to a signal amplifying circuit.

BACKGROUND OF THE INVENTION

Systems for controlling speed, torque and/or position of DC motors are known and have been widely used in a variety of applications including automotive control systems. Generally, such DC motors fall into two broad categories; namely brushed DC motors and brushless DC motors. While brushless DC motors typically offer desirable performance features and certain advantages over brushed DC motors in an automotive environment, such features and advantages may often be offset by the complexity of motor control and motor drive circuits required to accurately control motor operation. For example, controlled stoppage, accurate motor shaft positioning, motor reversal and consistent control of motor output torque are all difficult to achieve with brushless DC motors.

Dedicated systems for controlling and driving brushless DC motors are known. In such systems, a motor control circuit is typically operable to detect motor shaft position as well as motor drive current, and a motor drive circuit is, in turn, responsive to motor control signals supplied by the motor control circuitry to drive the DC motor in a desired manner. In known DC motor control systems, the motor control circuit typically includes a number of motor position sensors for providing a corresponding number of signals indicative of motor position as well as a sense amplifier operable to amplify one or more signals corresponding to motor drive current. The motor control circuit is typically responsive to motor position and/or motor drive current to provide the motor control signals to the motor drive circuit. Generally, the resolution of the motor control circuit is dependent upon the performance of the sense amplifier as well as the accuracy of the motor position detection circuitry. However, sense amplifiers of the type typically used in DC motor control systems are commonly configured for high DC gain, and due to mismatching in gain stage devices as well as other sources of error, such sense amplifiers may accordingly exhibit an unacceptably large amplified DC offset voltage error. This DC offset voltage error results in a degradation of the maximum dynamic range of the motor control circuit and hence the resolution of the system.

While known DC offset voltage compensation circuits have been used in various amplifier circuits, such DC offset voltage compensation circuits suffer from a number of drawbacks. For example, one known DC offset voltage compensation circuit is disclosed in U.S. Pat. No. 4,356,450 to Masuda, and includes a mechanical switch connected to a first one of the amplifier inputs and positionable between an input signal to be amplified and a reference potential. A DC offset compensation circuit is connected between the amplifier output and the remaining input of the amplifier. In order to perform a DC offset compensation cycle, the Masuda circuit undesirably requires actuation of the switch to thereby replace the signal to be amplified at the first input of the amplifier with the reference potential. The DC offset compensation circuit thereafter forces a compensating DC voltage onto the remaining amplifier input that is of sufficient magnitude to null the amplifier output voltage. The switch is once again actuated to thereby replace the reference signal at the first input of the amplifier with the signal to be amplified, wherein the amplifier is thereafter operable with the compensating DC voltage impressed upon the remaining input thereof.

While the Masuda DC offset voltage compensation circuit may be acceptable in some applications, inclusion of a mechanical switch may not be desirable in other applications, including certain automotive applications, due at least in part to reliability and cost concerns. Moreover, in some applications, it may not be desirable to divert the signal to be amplified from the sense amplifier during powered conditions. What is therefore needed is an improved DC offset compensation approach for a signal amplifier that minimizes an aggregate DC offset voltage attributable to a signal amplifier while minimizing required mechanical and/or electromechanical componentry. Ideally, such an improved DC offset compensation approach should allow DC offset compensation cycles to be performed without interrupting the signal amplifying operation of the amplifier.

SUMMARY OF THE INVENTION

The present invention addresses the foregoing shortcomings in known DC offset compensation circuits. In accordance with one aspect of the present invention, a DC offset compensation circuit for a signal amplifier comprises a signal amplifier producing a first analog signal, a reference circuit producing a second analog signal, a comparator circuit responsive to the first and second analog signals to produce a comparator output signal as a function thereof, a counter circuit responsive to a first state of the comparator output signal to periodically update a digital count value thereof and to a second state of said comparator output signal to maintain a current value of said digital count value, and a converter circuit responsive to the digital count value to produce a third analog signal corresponding thereto, wherein the signal amplifier is responsive to the third analog signal to minimize a DC offset voltage attributable thereto.

In accordance with another aspect of the present invention, a method of compensating for a DC offset voltage attributable to a signal amplifier comprises the steps of providing an analog output signal of a signal amplifier and an analog reference signal to first and second inputs respectively of a comparator, periodically updating a digital count value of a counter in response to a first state of a comparator output signal of the comparator, maintaining a current value of the digital count value in response to a second state of the comparator output signal, converting the digital count value to an analog compensation signal, and providing the analog compensation signal to the signal amplifier, wherein the signal amplifier is responsive to the analog compensation signal to minimize a DC offset voltage attributable thereto.

One object of the present invention is to provide an improved DC offset compensation circuit for minimizing an aggregate DC offset voltage attributable to a signal amplifying circuit.

Other objects of the present invention will become more apparent from the following description of the preferred embodiment.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
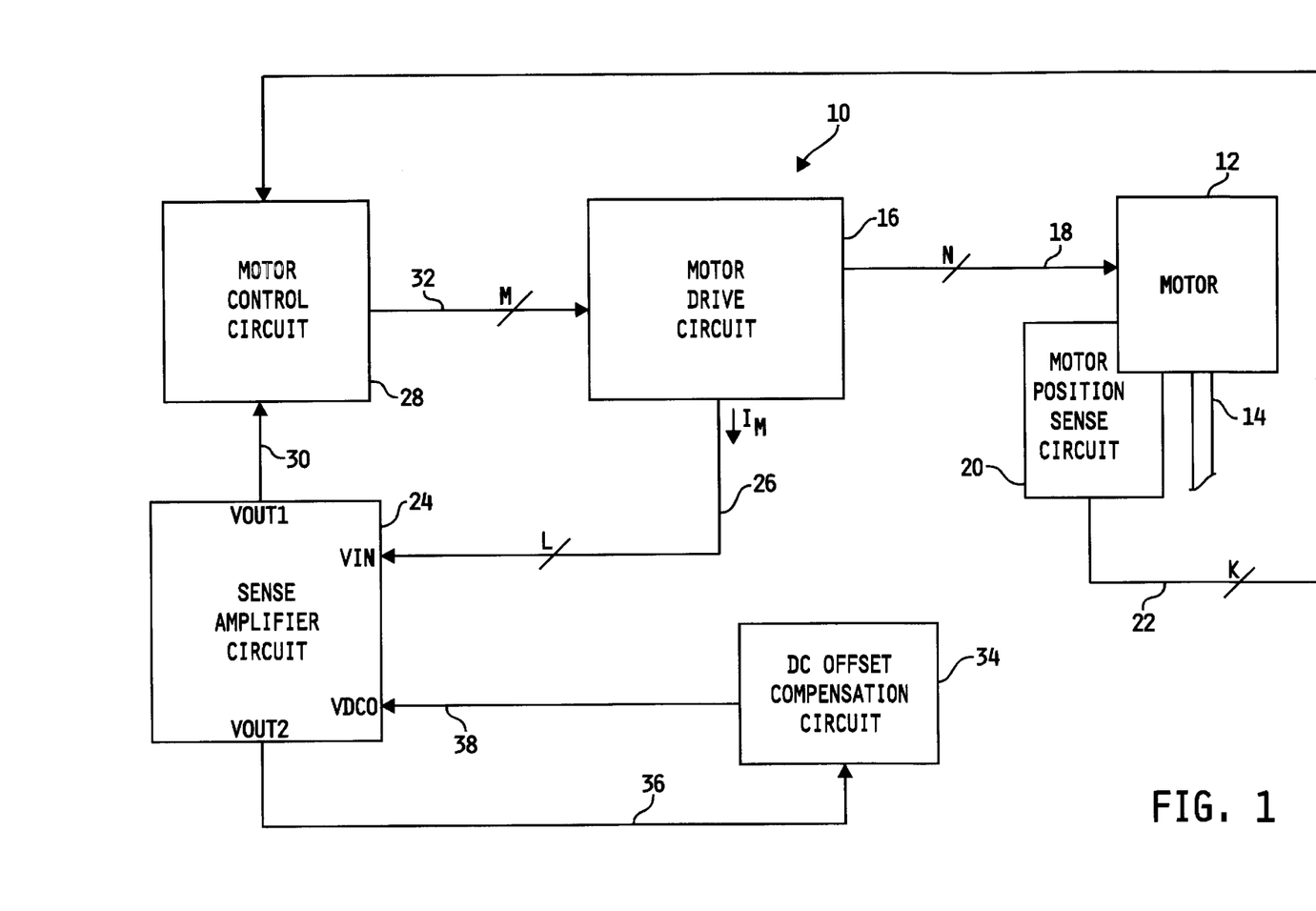
FIG. 1 is a diagrammatic illustration of one embodiment of a motor control system, in accordance with the present invention.

Referring now to FIG. 1, one embodiment of a motor control system 10, in accordance with the present invention, is illustrated. System 10 includes a DC motor 12, which is preferably a known brushless DC motor, operable to drive a rotor or output shaft 14 as is known in the art. Motor 12 is electrically connected to a motor drive circuit 16 via a number, N, of signal paths 18, wherein N may be any integer. Motor drive circuit 16 is operable to provide appropriate motor drive signals on signal paths 18, whereby motor 12 is responsive to such signals to actuate rotor 14 as is known in the art. In one embodiment, the motor drive circuit 16 is partitioned into a predriver circuit and a power drive circuit, and one preferred embodiment of such a motor drive circuit is described in co-pending U.S. application Ser. No. 09/290,594 filed by Seyed R. Zarabadi, which is assigned to the assignee of the present invention.

A motor position sense circuit 20 is, in one embodiment, associated with motor 12, wherein sense circuit 20 is operable to sense a position (and rotational speed) of rotor 14 relative to a motor armature (not shown) in a known manner. Preferably, motor position sense circuit 20 includes, in this embodiment, a number of Hall effect sensors operable to sense rotor position and produce a corresponding number of rotor position signals as is known in the art. Alternatively, sense circuit 20 may include a number of other known sensors or sensing circuits operable to sense rotor position and produce a corresponding number of rotor position signals, an example of which includes, but is not limited to, a variable reluctance sensor. In either case, motor position sense circuit 20 is operable to provide a number, K, of motor position signals to a motor control circuit 28 of known construction via a number, K, of corresponding signal paths 22, wherein K may be any integer.

Motor drive circuit 16 includes known circuitry therein for detecting motor winding current $I_M$ and providing a number, L, of analog signals indicative thereof to an input VIN of a sense amplifier circuit 24 via a corresponding number, L, of signal paths 26, wherein L may be any integer. Sense amplifier circuit 24 further includes a first output VOUT1 electrically connected to motor control circuit 28 via signal path 30, wherein sense amplifier circuit 24 is operable to provide an amplified representation of the number, L, of analog motor current signals to control circuit 28 via signal path 30. The motor control circuit 28 is electrically connected to motor drive circuit 16 via a number, M, of signal paths 32, wherein M may be any integer. Motor control circuit 28 is operable to receive the number, K, of analog motor position signals provided thereto by motor position sense circuit 20 as well as the number, L, of analog motor current signals provided thereto by sense amplifier 24, and provide motor drive circuit 16 with the number, M, of motor control signals, whereby motor drive circuit 16 is responsive to the number, M, of motor control signals to drive motor 12 in accordance therewith, as is known in the art. In one embodiment, motor control circuit 28 is a microprocessor or includes a microprocessor-based control circuit capable of discerning a current motor position from the number, K, of analog motor position signal provided by motor position sense circuit 20, and capable of discerning motor winding current from the number, L, of motor current signals provided by sense amplifier circuit 24. Based at least on the current motor position and motor winding current, motor control circuit 28 is operable to determine a number, M, of motor control signals indicative of desired motor control, as is known in the art.

In accordance with the present invention, sense amplifier circuit 24 further includes a second output VOUT2 electrically connected to an input of a DC offset compensation circuit 34 via signal path 36. DC offset compensation circuit 34 includes an output that is electrically connected to a input VDCO of sense amplifier circuit 24 via signal path 38. As will be described more fully hereinafter, DC offset compensation circuit 34 is operable to minimize an aggregate DC offset voltage attributable to sense amplifier circuit 24 in order to maintain a full dynamic range of motor control system 10. Details of one preferred embodiment of sense amplifier circuit 24 are described in co-pending U.S. patent application Ser. No. 09/290,835, filed by Seyed R. Zarabadi, which is assigned to the assignee of the present invention.

Figure 2:
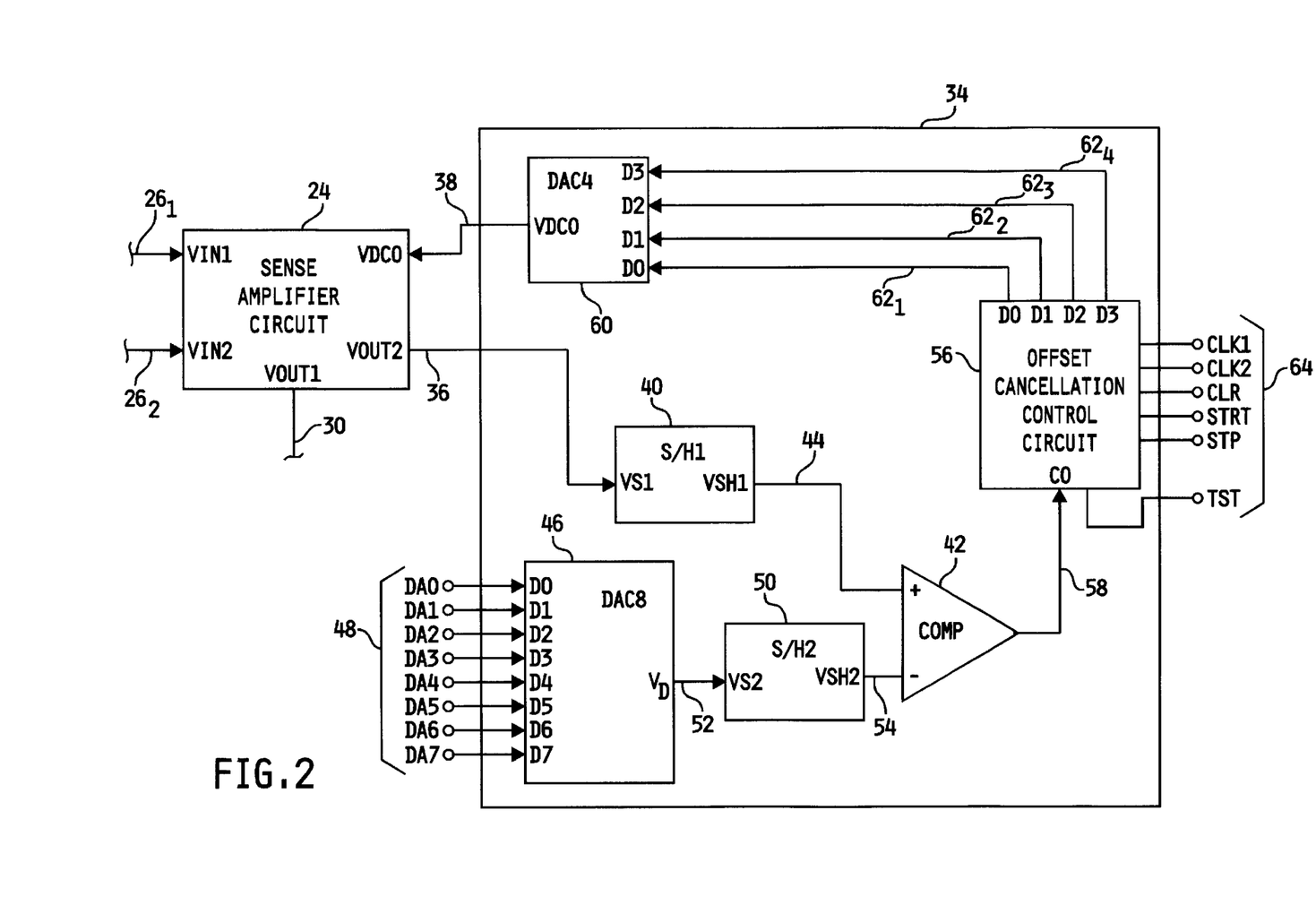
FIG. 2 is a diagrammatic illustration of one preferred embodiment of the DC offset compensation circuit portion of the motor control system illustrated in FIG. 1, in accordance with the present invention.

Referring now to FIG. 2, one preferred embodiment of the DC offset compensation circuit 34, in accordance with the present invention, is shown. Circuit 34 includes a first sample and hold circuit 40 of known construction having an analog input VS1 electrically connected to output VOUT2 of the sense amplifier circuit 24 via signal path 36. An analog output VSH1 of sample and hold circuit 40 is electrically connected to a non-inverting input of a comparator circuit 42 of known construction. A first digital-to-analog converter (D/A) circuit 46 of known construction has a number of digital inputs 48 adapted to receive a corresponding number of digital signals thereat. Preferably, the number of digital inputs 48 of D/A 46 are electrically connected to an external circuit such as a microprocessor or other control circuit, or alternatively to motor control circuit 28 of FIG. 1. In any case, D/A 46 may include any number of such digital inputs, and in one preferred embodiment, D/A 46 includes eight such digital inputs D0–D7. An analog output $V_D$ of D/A 46 is electrically connected to an analog input VS2 of a second sample and hold circuit 50 of known construction, and an analog output VSH2 of sample and hold circuit 50 is electrically connected to an inverting input of comparator 42 via signal path 54.

An output of comparator 58 is electrically connected to an input CO of an offset cancellation control circuit 56, wherein details of one preferred embodiment of offset cancellation control circuit 56 will be described more fully hereinafter. Offset cancellation control circuit 56 includes a number of additional inputs 64 including a first clock signal CLK1, a second clock signal CLK2, a clear signal CLR, a start signal STRT, a stop signal STP and a test signal TST. Preferably, the number of additional inputs 64 of circuit 56 are electrically connected to an external circuit such as a microprocessor or other control circuit, or alternatively to motor control circuit 28 of FIG. 1. In any case, offset cancellation control circuit 56 further includes a number of digital outputs electrically connected to a corresponding number of digital inputs of a second digital-to-analog converter circuit (D/A) 60 of known construction, wherein an analog output VDCO of D/A 60 is connected to the offset voltage compensation input VDCO of sense amplifier circuit 24 via signal path 38. Offset cancellation control circuit 56 and D/A 60 may include any number of digital outputs and digital inputs respectively, and in one preferred embodiment offset cancellation control circuit 56 includes four such digital outputs D0–D3 electrically connected to corresponding inputs D0–D3 of D/A 60 via signal paths $62_1$–$62_4$ as shown in FIG. 2.

Figure 3:
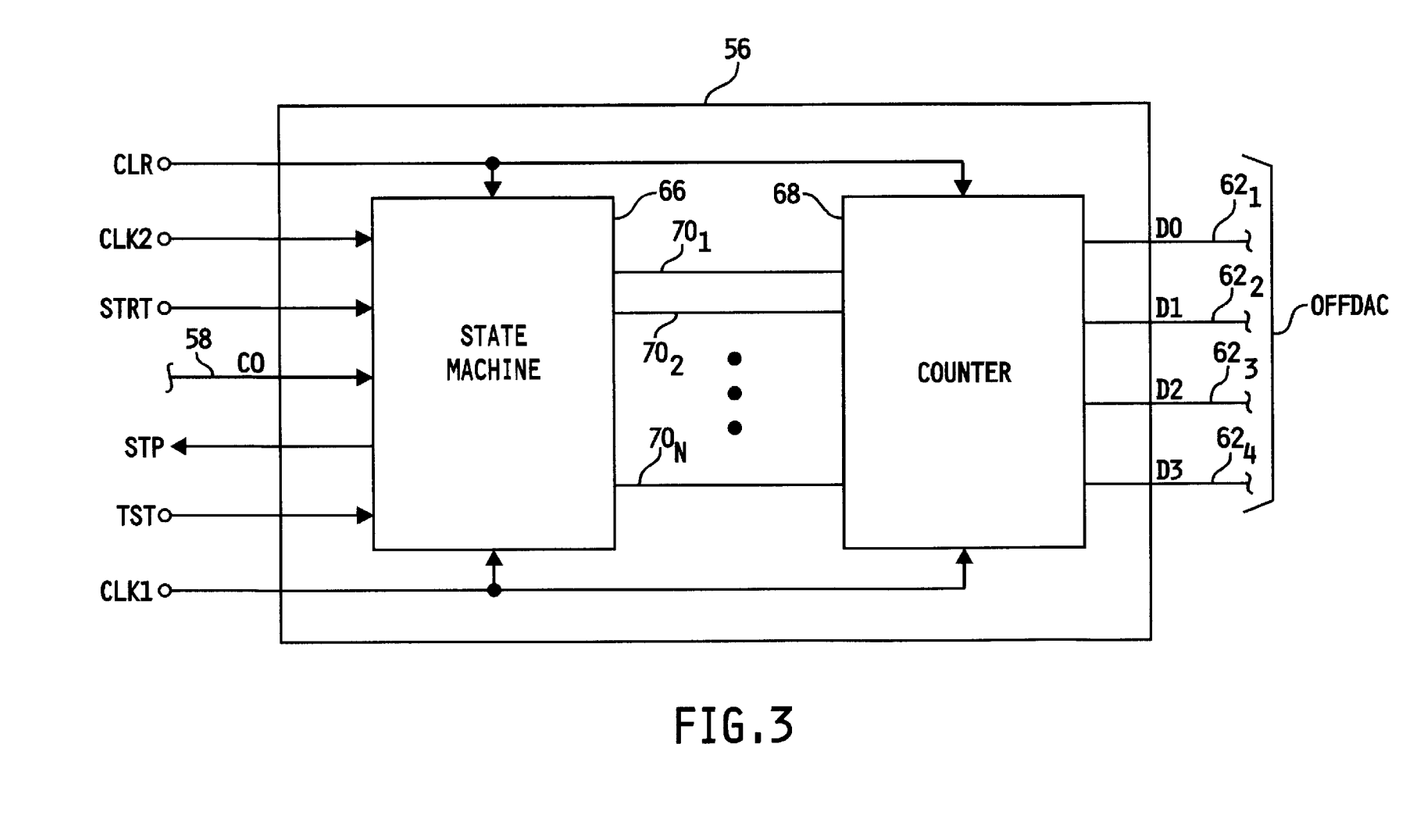
FIG. 3 is a block diagram illustrating one preferred embodiment of the offset cancellation control circuit of FIG. 2, in accordance with the present invention.

Referring now to FIG. 3, a block diagram illustrating one preferred embodiment of the offset cancellation control circuit 56 of FIG. 2, in accordance with the present invention, is shown. Circuit 56 includes a state machine 66 having inputs connected to CLR, CLK2, STRT, CO, TST and CLK1 as shown from top to bottom in FIG. 3, and an output STP. State machine 66 is electrically connected to a counter circuit 68 via a number N of signal paths $70_1, 70_2, \ldots, 70_N$, wherein N may be any integer. Counter circuit 68 includes input connected to CLR and CLK1, and outputs D0–D3 ($62_1$–$62_4$), wherein the signals produced by counter circuit 68 on signal paths ($62_1$–$62_4$) will be referred to hereinafter as a digital output signal OFFDAC as shown in FIG. 3.

Figure 4A:
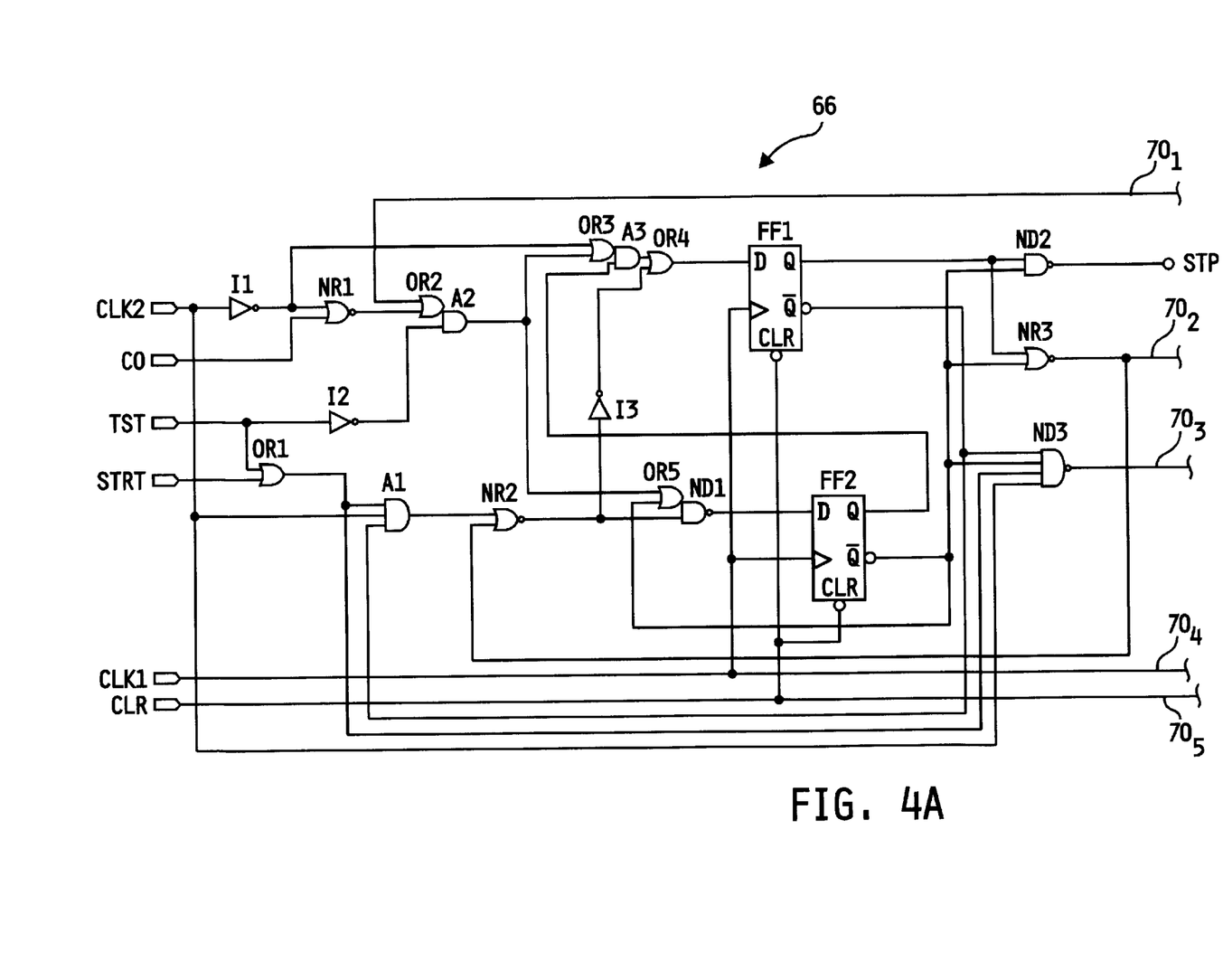
FIG. 4 is composed of FIGS. 4A and 4B and is a logic gate schematic diagram of one preferred embodiment of the offset cancellation control circuit of FIGS. 2 and 3, in accordance with the present invention.
Figure 4B:
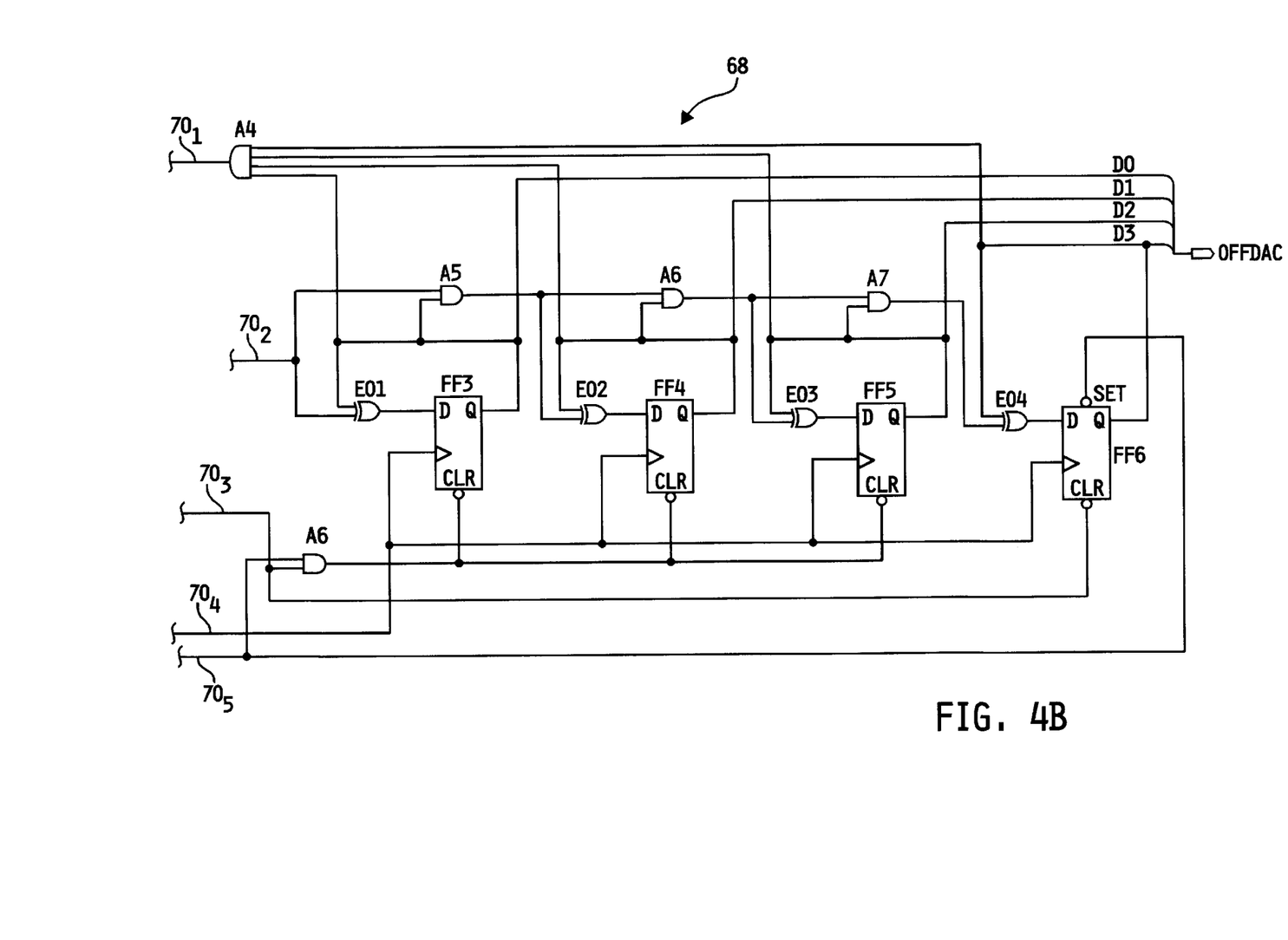

Referring now to FIGS. 4A and 4B, a logic gate schematic of one preferred embodiment of offset cancellation control circuit 56, in accordance with the present invention, is shown. Referring specifically to FIG. 4A, one preferred embodiment of the state machine 66 of FIG. 3 is illustrated wherein the CLK2 input is connected to an input of an inverter I1, to one input of an AND gate A1 and to one input of a NAND gate ND3. The output of I1 is connected to one input of a NOR gate NR1 and to one input of an OR gate OR3, wherein a second input of NR1 is connected to the output CO of comparator 42 (FIG. 2). An output of NR1 is connected to one input of an OR gate OR2, wherein a second input of OR2 is connected to signal path $70_1$ provided by the counter circuit 68 of FIG. 4B. An output of OR2 is connected to one input of an AND gate A2, wherein a second input of A2 is connected to an output of an inverter I2, the input of which is connected to one input of an OR gate OR1 and to the TST input of circuit 66. The output of A2 is connected to a second input of OR gate OR3 and to one input of another OR gate OR5.

The STRT input of circuit 66 is connected to a second input of OR gate OR1, wherein the output of OR1 is connected to a second input of A1 and to a second input of ND3. The output of A1 is connected to one input of a NOR gate NR2, wherein the output of NR2 is connected to an input of an inverter I3 and to one input of a NAND gate ND1. A second input of ND1 is connected to an output of OR5, wherein a second input of OR5 is connected to a Q' output of a D-type flip-flop circuit FF2, to a third input of ND3, to one input of a NOR gate NR3 and to one input of a NAND gate ND2. The output of ND1 is connected to a D input of FF2. A Q output of FF2 is connected to one input of an AND gate A3, wherein a second input of A3 is connected to the output of OR3. The output of A3 is connected to one input of an OR gate OR4, wherein a second input of OR4 is connected to an output of I3, and wherein the output of OR4 is connected to a D input of a D-type flip-flop circuit FF1. A Q' output of FF1 is connected to a fourth input of ND3 and to a third input of A1, wherein the output of ND3 is connected to signal path $70_3$ leading to the counter circuit 68 of FIG. 4B. The Q output of FF1 is connected to a second input of ND2, the output of which is connected to the STP output of circuit 66, and to a second input of NR3. The output of NR3 defines a signal path $70_2$ leading to the counter circuit 68 of FIG. 4B and is also connected to a second input of NR2. The CLK1 input of circuit 66 is connected to clock inputs of FF1 and FF2, and defines a signal path $70_4$ leading to counter circuit 68 of FIG. 4B. The CLR input of circuit 66 is similarly connected to CLR inputs of FF1 and FF2, and defines a signal path $70_5$ leading to counter circuit 68 of FIG. 4B.

Referring now to FIG. 4B, one preferred embodiment of a logic gate schematic of the counter circuit 68 of FIG. 3 is illustrated wherein signal path $70_1$ provided by the state machine 66 of FIG. 4A is connected to an output of an AND gate A4. One input of A4 is connected to one input of an exclusive-OR gate EO1, to one input of an AND gate A5, to a Q output of a D-type flip-flop circuit FF3, and defines the D0 output of counter circuit 68. A second input of A4 is connected to one input of an exclusive-OR gate EO2, to one input of an AND gate A6, to a Q output of a D-type flip-flop circuit FF4, and defines the D1 output of counter circuit 68. A third input of A4 is connected to one input of an exclusive-OR gate EO3, to one input of an AND gate A7, to a Q output of a D-type flip-flop circuit FF5, and defines the D2 output of counter circuit 68. A fourth input of A4 is connected to one input of an exclusive-OR gate EO4, to a Q output of a D-type flip-flop circuit FF6, and defines the D3 output of counter circuit 68.

Signal path $70_2$ is connected to a second input of A5 and to a second input of EO1, wherein the output of EO1 is connected to the D input of FF3. The output of A5 is connected to a second input of A6 and to the second input of EO2, wherein the output of EO2 is connected to the D input of FF4. The output of A6 is connected to the second input of A7 and to the second input of EO3, wherein the output of EO3 is connected to the D input of FF5. The output of A7 is connected to the second input of EO4 and the output of EO4 is connected to the D input of FF6. Signal path $70_3$ is connected to one input of an AND gate A6 and to a first CLR input of FF6. A second input of A6 is connected to signal path $70_5$ and to a SET input of FF6. The output of A6 is connected to the CLR inputs of FF3, FF4 and FF5. Finally, signal path $70_4$ is connected to the clock inputs of FF3, FF4, FF5 and FF6.

The operation of the DC offset cancellation control circuit 34 of FIGS. 1 and 2, and the operation of the offset cancellation control circuit 56 of FIGS. 2–4B will now be described with reference to the timing diagram of FIG. 5. Referring to FIGS. 1 and 2, the sense amplifier 24 has an inherent dc offset value associated therewith, as do all physically realizable signal amplifiers, wherein the inherent DC offset value of amplifier 24 is a result of many factors including, but not limited to, a mismatch among the input devices as well as the components defining the DC gain of the amplifier circuit 24. If not minimized, the input referred DC offset voltage of amplifier 24 may result in an unacceptably large DC offset value at the amplifier output due to the large closed-loop gain thereof, which may correspondingly result in an unacceptable reduction in the dynamic range of system 10. In accordance with the present invention, the DC offset compensation circuit 34 is operable to compare the amplified DC component of the signal at the output VOUT2 of amplifier 24 with an analog target DC signal, and provide an analog DC offset compensation signal to input VDCO of amplifier circuit 24, wherein the DC offset compensation signal resulting from a DC offset compensation cycle of circuit 34 is applied to the input of amplifier circuit 24 to thereby drive the DC component of the amplifier output signal at VOUT2 (and also at amplifier output VOUT1) to the analog target DC signal, thereby minimizing the aggregate DC offset voltage of sense amplifier circuit 24 to a desired range or value. In the embodiment of the DC offset compensation circuitry 34 illustrated in FIG. 2, the analog target DC offset signal is provided at the output $V_D$ of D/A circuit 46 in accordance with a corresponding digital instruction signal at digital inputs 48 thereof. In one embodiment, the digital instruction signal is an eight-bit digital signal supplied by a remote microprocessor, microprocessor-based circuit or other control circuit (not shown), although the present invention contemplates that the digital instruction signal may alternatively be any number of bits in length and may alternatively be supplied by any suitable circuit including motor control circuit 28 (FIG. 1). Those skilled in the art will recognize that the desired accuracy/resolution of the analog target DC signal provided at output VD of D/A circuit 46 will, in most cases, dictate the number of digital inputs 48 required of D/A circuit 46. In any case, the analog target DC signal provided at output VD of D/A circuit 46 is fed through sample and hold circuit 50 to the inverting input of comparator circuit 42. Likewise, the analog amplifier output voltage provided at output VOUT2 of amplifier circuit 24 is fed through sample and hold circuit 40 to the non-inverting input of comparator circuit 42.

The offset cancellation control circuit 56 is operable to control the time and timing of an offset compensation cycle of circuit 34. Generally speaking, offset cancellation control circuit 56 is responsive to a change in state of the start signal STRT to begin counting and provide a corresponding count value at the OFFDAC output thereof. Preferably, offset cancellation control circuit 56 is responsive to a rising edge of the STRT signal to periodically increment the count value at output OFFDAC (FIG. 3) at a rate determined by CLK2, although the present invention contemplates that circuit 56 may alternatively be responsive to a falling edge of the STRT signal to increment the count value, or to a rising or falling edge of the STRT signal to periodically decrement the count value at output OFFDAC. In either case, offset cancellation control circuit 56 is preferably responsive to the change of state of the STRT signal to count from a suitable predetermined count value as will be described in greater detail hereinafter. The D/A circuit 60 is responsive to the changing count value provided to inputs D0–D3 thereof to provide a corresponding analog DC offset compensation signal to output VDCO thereof, wherein the analog DC offset compensation signal is applied to the VDCO input of signal amplifier circuit 24. Application of the analog DC offset compensation signal to the input of the signal amplifier circuit 24 results in a reduction of the DC portion of amplifier output signal at VOUT2 of sense amplifier circuit 24 as the counting operation of offset cancellation control circuit 56 progresses. When the DC portion of the amplifier output signal at VOUT2 reaches the analog target DC signal at output $V_D$ of D/A circuit 46, comparator 42 changes state, thereby halting the counting operation of offset cancellation control circuit 56 and latching the analog DC offset compensation signal provided at the VDCO output of D/A circuit 60 at its most recent value. The resulting analog DC offset compensation signal provided to the VDCO input of sense amplifier circuit 24 is suitable to maintain the DC component of the sense amplifier output signal near the analog target DC signal at output $V_D$ of D/A circuit 46.

The change of state in the STRT signal that begins a DC offset compensation cycle of circuit 34 preferably occurs at least at every power-up of system 10, although the present invention contemplates that such a DC offset compensation cycle may be carried out at any desired times in accordance with any desired criteria. For example, the remote control circuit supplying the STRT signal may be programmed to initiate a DC offset compensation cycle, as described hereinabove, periodically, as required by temperature changes, or by the occurrence of one or more alternative events. Also, while offset cancellation control circuit 56 and D/A circuit 60 are shown in FIG. 2 as having four digital outputs and four digital inputs respectively, those skilled in the art will recognize that these circuits may be configured for any desired number of digital inputs/outputs. As a practical matter, the number of digital inputs/outputs of these circuits will depend, in large part, upon the desired accuracy/resolution of the resulting analog DC offset compensation signal provided at output VDCO of D/A circuit 60.

Referring to FIGS. 2–5, the operation of the offset cancellation control circuit 56 will now be described in detail. Circuit 56 is operable to control the timing of the DC offset cancellation cycle as well as allowing for the testing thereof. As described hereinabove, the signals CLK1, CLK2, CLR STRT, and TST are control signals preferably supplied by a remote microprocessor, microprocessor-based circuit or other control circuit, although the present invention contemplates that such signals may alternatively be provided by a control circuit within system 10 such as, for example, the motor control circuit 28. In any case, clock signal CLK1 is preferably a 50% duty cycle square-wave clock signal, and clock signal CLK2 is preferably a timing strobe signal occurring every 40 cycles of CLK1 with a width of a single CLK1 period. The clear signal CLR is preferably an asynchronous active-low reset signal asserted at every power-up of system 10. The STRT signal, as described hereinabove, is a control signal that instructs offset cancellation control circuit 56 to undertake a DC offset compensation cycle. The STP signal is a control signal produced by the offset cancellation control circuit 56, wherein circuit 56 is preferably responsive to the change in state of the output of the comparator circuit 42 at the end of a DC offset compensation cycle, as described hereinabove, to produce an active-low STP signal to thereby provide an indication to a remote processor or other control circuit that the DC offset compensation cycle is complete. Finally, the test signal TST is preferably an active-high signal that allows testing of the offset cancellation control circuit 56.

During power-up, or at any other time it is desirable to execute a DC offset compensation cycle, the CLR signal is asserted. Under power-up conditions or at any other desired time that motor 12 is inactive, the output of sense amplifier circuit will be equal to some DC voltage. Under such conditions, the DC offset compensation circuit 34 is responsive to assertion of the CLR signal to undergo a DC offset compensation cycle, whereby the sense amplifier circuit 24 is responsive to the final DC offset compensation signal provided to input VDCO thereof to adjust the DC output voltage (at outputs VOUT1 and VOUT2) to the reference DC voltage provided at output $V_D$ of D/A 46, thereby compensating for and minimizing the aggregate DC offset voltage attributable to sense amplifier circuit 24. In any case, the CLR signal 80 is shown in FIG. 5 as being asserted to an active-high state at time t=0. Assertion of the CLR signal asynchronously resets FF3–FF6 (FIG. 4B) such that OFF-DAC is set to a value of eight hexidecimal as shown by the OFFDAC signal 88 in FIG. 5. It is to be understood, however, that counter circuit 68 of FIG. 4B may be alternatively configured to provide for any desired preset OFF-DAC value upon assertion of the CLR signal. In any case, a DC offset compensation cycle is triggered by the assertion thereafter of the STRT signal as shown by signal 84 in the timing diagram of FIG. 5. Propagation of the logic high state of the STRT signal through gates OR2, ND3 and A6 resets the Q output of FF6 to a low state, thereby resetting OFFDAC to zero hexidecimal on the next CLK2 pulse following assertion of the STRT signal as shown by OFF-DAC signal 88 in FIG. 5. Those skilled in the art will recognize that the offset cancellation control circuit 56 may alternatively be configured to set OFFDAC to any desired value upon assertion of the STRT signal.

After OFFDAC is reset to zero hexidecimal by the assertion of the STRT signal, the state machine 66 waits for the next timing strobe of the CLK2 signal 82 and does one of two things depending upon the state of the output signal CO 86 of the comparator 42. If, as shown in FIG. 5, CO is high on the next CLK2 pulse after resetting OFFDAC to zero hexidecimal, the DC offset compensation cycle is not yet complete and the state machine 66 directs the counter circuit 68 to increment OFFDAC by one coincident with the CLK2 pulse. Those skilled in the art will recognize that state machine 66 and counter circuit 68 may alternatively be configured such that counter circuit 68 increments OFFDAC if CO is low on the next CLK2 pulse after resetting OFF-DAC to zero. In another alternative embodiment, state machine 66 and counter circuit 68 may be configured to decrement the OFFDAC value if CO is either high or low on the next CLK2 pulse after resetting OFFDAC to any desired value following assertion of the STRT signal. Alternatively still, state machine 66 and counter circuit 68 may be configured to modify (increment or decrement) the OFF-DAC value by any desired step value if CO is either high or low on the next CLK2 pulse after resetting OFFDAC to any desired value following assertion of the STRT signal.

Referring again to FIG. 5, as long as the comparator output signal CO remains in a high state, the state machine 66 is operable to control the counter circuit 68 to increment the count value OFFDAC coincident with the CLK2 pulses. If at any time during the counting process the comparator output signal CO changes state (goes to a low state in the example shown in FIG. 5), the DC offset compensation cycle is complete and state machine 66 asserts a STP signal 90 coincident with the next CLK2 pulse following the change of state of the comparator output signal CO. In the example illustrated in FIG. 5, the state machine 66 is operable to switch the STP signal from a high to a low state for the duration of the CLK2 pulse, although the present invention contemplates that state machine 68 may alternatively be configured to switch the STP signal from a low to a high state for any desired duration following the change of state of the comparator output signal CO. The remote control circuit supplying the digital input signals 64 (FIG. 2) is preferably responsive to the STP pulse to asynchronously deactivate the STRT signal as illustrated in FIG. 5 to thereby end the DC offset compensation cycle. If, however, the comparator output signal CO remains high after the counter circuit 68 reaches its maximum count value (hexidecimal 15 in the example illustrated in FIG. 5), the state machine 66 is operable to assert the STP signal as just described to thereby halt the DC offset compensation cycle. In either case, the counter circuit 68 is operable to maintain indefinitely at outputs D0–D3 thereof the OFFDAC value at the time the STRT signal 84 changed back to a low state.

Figure 5:
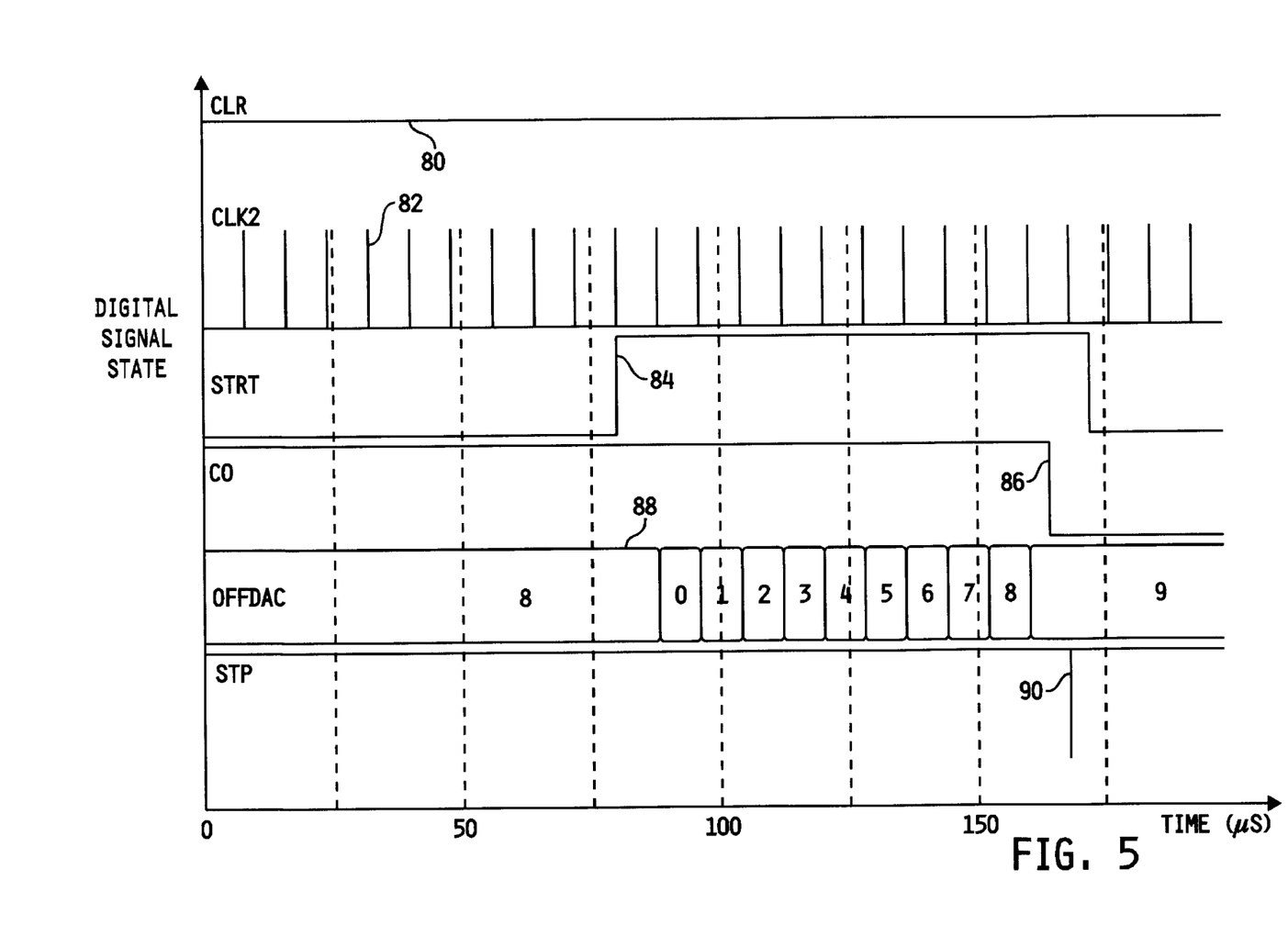
FIG. 5 is a timing diagram illustrating the operation of the offset cancellation control circuit of FIGS. 4A and 4B.

If the DC offset cancellation process is triggered by assertion of the TST signal (not shown) instead of the STRT signal as illustrated in FIG. 5, state machine 66 is operable to control the counter circuit 68 to reset to a value of zero hexidecimal on the next CLK2 pulse following assertion of the TST signal. On subsequent CLK2 pulses, OFFDAC is incremented by one regardless of the state of the comparator output signal CO. When the counter circuit 68 reaches its terminal count, the state machine 66 will control the counter circuit 68 to roll over to zero hexidecimal coincident with the next CLK2 pulse rather than asserting the STP signal 90 as described previously. The counter circuit 68 will continue to count in this manner until both the TST signal is de-asserted and the comparator output signal CO is low. By asserting the TST signal as just described, the state machine 66 and counter circuit 68 may accordingly be controlled in a test mode whereby the counter circuit 68 is operable to continually count and reset.

Figure 6:
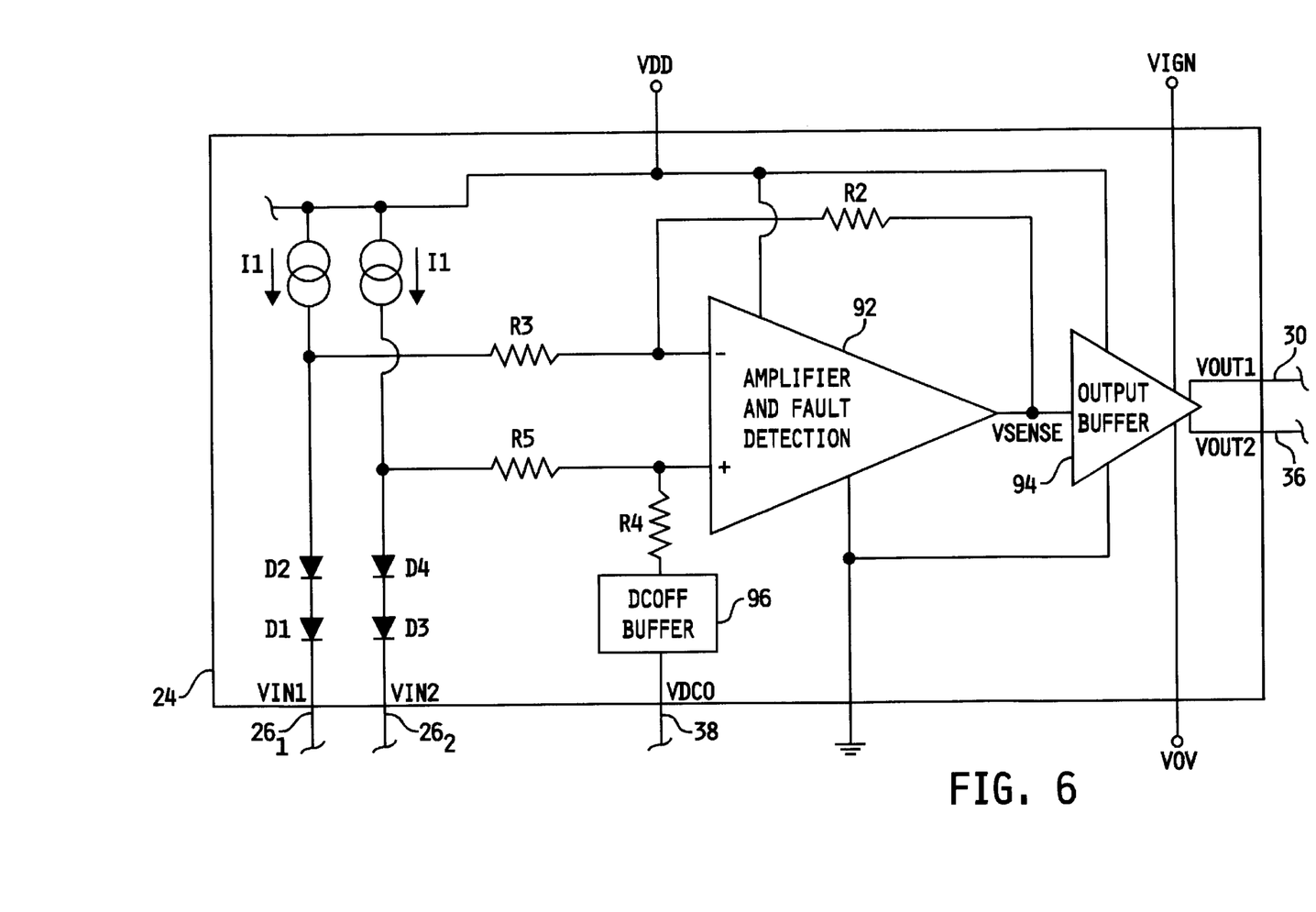
FIG. 6 is a diagrammatic illustration of one preferred embodiment of the sense amplifier circuit of FIG. 1, in accordance with the present invention.

Referring now to FIG. 6, one embodiment of the sense amplifier circuit 24, in accordance with the present invention, is shown. As it relates to the present invention, sense amplifier circuit includes an amplifier 92 having an inverting input coupled through a resistor R3 to a first amplifier input VIN1. A feedback resistor R2 is connected between the inverting input and an output of amplifier 92, wherein the output of the amplifier 92 is coupled to outputs VOUT1 and VOUT2 through an output buffer 94. The analog DC offset compensation signal produced by DC offset compensation circuit 34 is provided to an input VDCO of a buffer circuit DCOFF buffer 96. The output of the DCOFF buffer 96 is coupled through a resistor R4 to the non-inverting input of amplifier 92, which is also coupled through a resistor R5 to a second input VIN2 of sense amplifier circuit 24. The gain of sense amplifier circuit 24 is determined by the resistor ratios R4/R5 and R2/R3. Further details of the structure and operation of the sense amplifier circuit 24 of FIG. 6 are provided in co-pending U.S. patent application Ser. No. 09/290,835, filed by Seyed R. Zarabadi.

Figure 7:
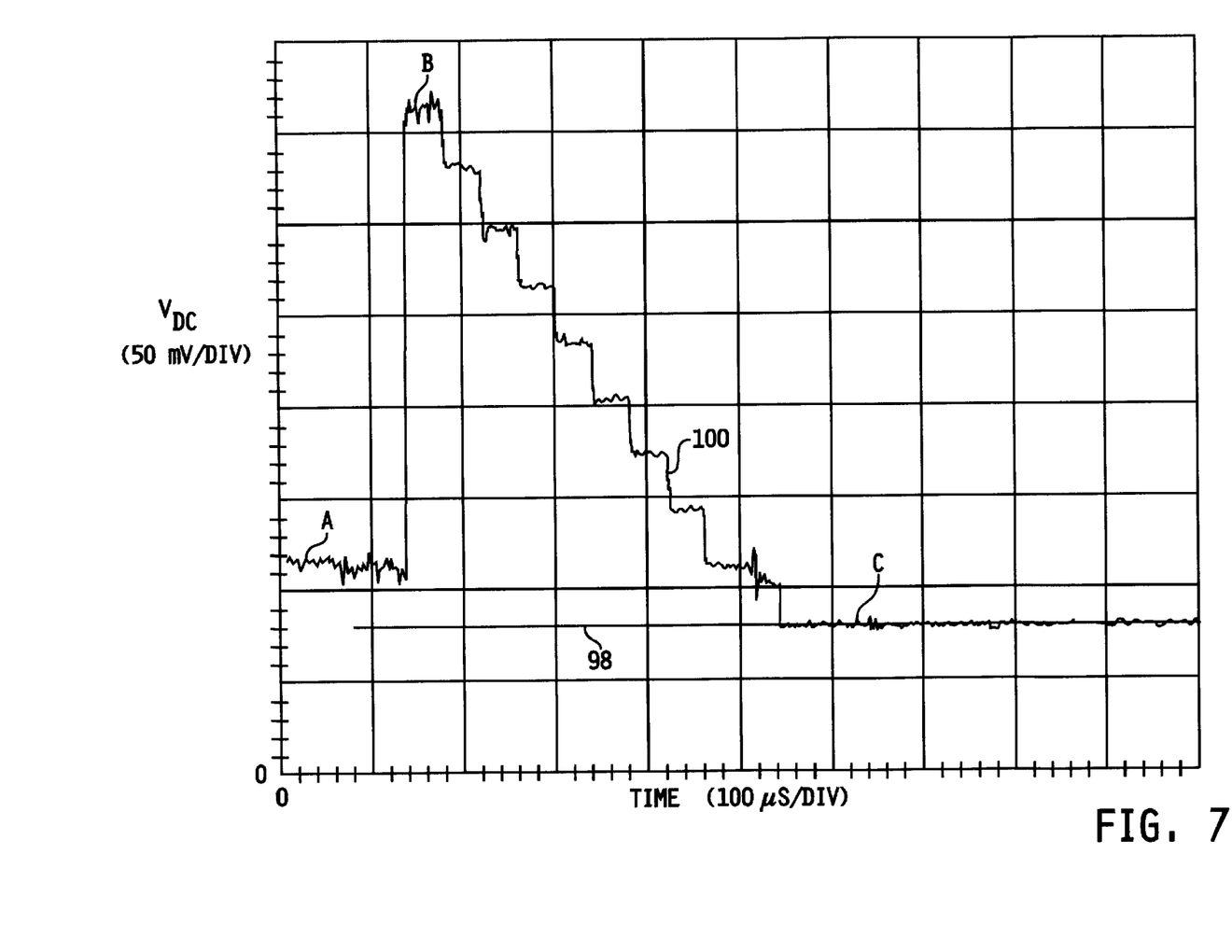
FIG. 7 is a plot of sense amplifier DC output voltage vs. time illustrating the effect on sense amplifier DC output voltage of a DC offset compensation cycle performed by the DC offset compensation circuit of FIGS. 1–5, in accordance with the present invention.

The analog DC offset compensation signal provided to DCOFF buffer 96 by the DC offset compensation circuit 34 is applied to the non-inverting input of amplifier 92 throughout the DC offset compensation cycle just described to thereby force the analog DC component of the amplifier output signal at VOUT2 (and VOUT1) to the analog DC target voltage $V_D$ produced by D/A circuit 46 (FIG. 2). The DC offset compensation circuit 34 is thus operable to minimize an aggregate DC offset voltage attributable to the entire sense amplifier circuit 24 including amplifier and fault detection circuit 92 and output buffer 94. Referring to FIG. 7, a plot of DC voltage vs. time is provided illustrating an example of a resulting VOUT2 signal 100 as compared to an analog DC target voltage $V_D$ 98 throughout a DC offset compensation cycle as described hereinabove. The section of the VOUT2 signal 100 labelled "A" represents the presetting of OFFDAC to a value of eight hexidecimal following assertion of the CLR signal. The section of the VOUT2 signal 100 labelled "B" represents the presetting of OFFDAC to a value of zero hexidecimal following assertion of the STRT signal as described above. As illustrated in FIG. 7, the DC offset compensation circuit 34 is thereafter operable to perform a DC offset compensation cycle whereby the DC component of VOUT 2 is successively reduced to the analog DC target voltage 98, as shown by the section of the VOUT2 signal 100 labelled "C", by controlling the counter circuit 68 to a count value of nine hexidecimal.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. A DC offset compensation circuit comprising:
a signal amplifier producing a first analog signal;
a reference circuit producing a second analog signal as a function of a number of digital reference signals;
a comparator circuit responsive to said first and second analog signals to produce a comparator output signal as a function thereof;
a counter circuit responsive to a first state of said comparator output signal to periodically update a digital count value thereof, said counter circuit responsive to a second state of said comparator output signal to maintain a current value of said digital count value; and
a converter circuit responsive to said digital count value to produce a third analog signal corresponding thereto, said signal amplifier responsive to said third analog signal to adjust a DC offset voltage attributable thereto.

2. The DC offset compensation circuit of claim 1 wherein said signal amplifier includes:
a first input;
a second input;
a third input receiving said third analog signal from said converter circuit; and
a signal amplifier output producing said first analog signal.

3. The DC offset compensation circuit of claim 2 wherein said first and second inputs of said signal amplifier are adapted to receive a differential input signal thereat.

4. The DC offset compensation circuit of claim 1 wherein said comparator circuit is operable to produce said first state of said comparator output signal when said first analog signal is greater than said second analog signal;
and wherein said comparator signal is operable to produce said second state of said comparator output signal when said first analog signal is substantially equal to said second analog signal.

5. The DC offset compensation circuit of claim 1 wherein said signal amplifier includes:
an amplifier circuit having an inverting input, an amplifier output producing a fourth analog output signal, a feedback path established between said inverting input and said amplifier output, and a non-inverting input receiving said third analog signal from said converter circuit; and
a buffer circuit having a buffer input receiving said fourth analog output signal and a buffer output producing said first analog signal, said DC offset compensation circuit operable to minimize an aggregate DC offset value attributable to said amplifier circuit and said buffer circuit as a function of said second analog signal.

6. A DC offset compensation circuit comprising:
a signal amplifier producing a first analog signal at an output thereof;
a reference circuit producing a second analog signal;
a first sample and hold circuit having an input connected to said output of said signal amplifier and an output;
a comparator circuit having a first input connected to said output of said first sample and hold circuit, a second input receiving said second analog signal and an output producing a comparator output signal;
a counter circuit responsive to a first state of said comparator output signal to periodically update a digital count value thereof, said counter circuit responsive to a second state of said comparator output signal to maintain a current value of said digital count value; and
a converter circuit responsive to said digital count value to produce a third analog signal corresponding thereto, said signal amplifier responsive to said third analog signal to adjust a DC offset voltage attributable thereto.

7. The DC offset compensation circuit of claim 6 further including a second sample and hold circuit having an input connected to an output of said reference circuit and receiving said second analog signal thereat, and an output connected to said second input of said comparator circuit.

8. The DC offset compensation circuit of claim 7 wherein said first input of said comparator is a non-inverting input and said second input of said comparator is an inverting input.

9. The DC offset compensation circuit of claim 7 wherein said reference circuit is a digital-to-analog converter (DAC) having a number of inputs adapted to receive a corresponding number of digital control signals, said DAC responsive to said corresponding number of digital control signals to produce said second analog signal, said second analog signal indicative of a desired DC voltage associated with said first analog signal.

10. A DC offset compensation circuit comprising:
a signal amplifier producing a first analog signal;
a reference circuit producing a second analog signal;
a comparator circuit responsive to said first and second analog signals to produce a comparator output signal as a function thereof;
a counter circuit having a number of outputs producing a corresponding number of digital output signals indicative of a digital count value thereof;
a state machine having a first input receiving said comparator output signal, said state machine responsive to a first state of said comparator output signal to periodically update said digital count value of said counter circuit and responsive to a second state of said comparator output signal to maintain a current value of said digital count value of said counter circuit; and
a converter circuit responsive to said digital count value of said counter circuit to produce a third analog signal corresponding thereto, said signal amplifier responsive to said third analog signal to adjust a DC offset voltage attributable thereto.

11. The DC offset compensation circuit of claim 10 wherein said state machine further includes a second input adapted to receive a start signal;
and wherein said counter is responsive to said start signal to thereafter periodically update said digital count value if said comparator is producing said first state of said comparator output signal.

12. The DC offset compensation circuit of claim 10 wherein said converter circuit is a digital-to-analog converter (DAC) having a number of inputs corresponding to said number of outputs of said counter circuit and an output, said DAC receiving said digital count value at said number of inputs thereof and producing said third analog signal at said DAC output.

* * * * *